US012765116B2

(12) United States Patent
Duan et al.

(10) Patent No.: US 12,765,116 B2
(45) Date of Patent: Oct. 13, 2026

(54) BACK-CONTACT SOLAR CELL AND PHOTOVOLTAIC MODULE

(71) Applicants: YUHUAN JINKO SOLAR CO., LTD, Yuhuan (CN); JINKO SOLAR (HAINING) CO., LTD., Haining (CN)

(72) Inventors: Weiyuan Duan, Yuhuan (CN); Yufeng Sun, Yuhuan (CN); Wenqi Li, Yuhuan (CN); Jie Yang, Yuhuan (CN); Xinyu Zhang, Yuhuan (CN)

(73) Assignees: YUHUAN JINKO SOLAR CO., LTD, Yuhuan (CN); JINKO SOLAR (HAINING) CO., LTD., Haining (CN)

( * ) Notice: Subject to any disclaimer, the term of this patent is extended or adjusted under 35 U.S.C. 154(b) by 0 days.

(21) Appl. No.: 19/210,362

(22) Filed: May 16, 2025

(65) Prior Publication Data

US 2026/0293367 A1 Sep. 24, 2026

(30) Foreign Application Priority Data

Mar. 18, 2025 (CN) ......................... 202510319642.6

(51) Int. Cl.
*H10F 77/30* (2025.01)

(52) U.S. Cl.
CPC .................................. *H10F 77/315* (2025.01)

(58) Field of Classification Search
CPC .... H10F 77/211; H10F 77/215; H10F 77/219; H10F 77/244; H10F 77/311
See application file for complete search history.

(56) References Cited

U.S. PATENT DOCUMENTS

2015/0263193 A1* 9/2015 Chung .................. H10F 71/121 136/256
2024/0170590 A1* 5/2024 Lin ....................... H10F 77/311
(Continued)

FOREIGN PATENT DOCUMENTS

AU 2024203651 B1 3/2025
CN 102044579 A * 5/2011 ........... H10F 77/219
(Continued)

OTHER PUBLICATIONS

English machine translation of Lin et al. (CN 116759473) published Sep. 15, 2023.*
(Continued)

*Primary Examiner* — Christina Chern
(74) *Attorney, Agent, or Firm* — Ballard Spahr LLP

(57) ABSTRACT

The present disclosure relates to a back-contact solar cell and a method for preparing the same, and a photovoltaic module. The back-contact solar cell includes: a substrate, with a back side provided with a first doped portion and a second doped portion that are arranged alternately; a first doped functional layer located on the first doped portion, wherein the first doped functional layer comprises a first doped semiconductor sub-layer and at least one barrier layer that are sequentially stacked in a direction away from the substrate; a second doped semiconductor layer located on the second doped portion; and a plurality of first conductive portions arranged on a side of the first doped functional layer away from the substrate, and a plurality of second conductive portions arranged on a side of the second doped semiconductor layer away from the substrate.

18 Claims, 5 Drawing Sheets

(56) References Cited

U.S. PATENT DOCUMENTS

| | | | |
|---|---|---|---|
| 2024/0266460 | A1 | 8/2024 | Wang et al. |
| 2024/0379882 | A1 | 11/2024 | Yang et al. |

FOREIGN PATENT DOCUMENTS

| | | | | | |
|---|---|---|---|---|---|
| CN | 116565034 | A | | 8/2023 | |
| CN | 116759473 | A | * | 9/2023 | ........... H10F 71/121 |
| CN | 117133812 | A | | 11/2023 | |
| CN | 117410384 | A | | 1/2024 | |
| CN | 117936616 | A | | 4/2024 | |
| CN | 118248749 | A | * | 6/2024 | ........... H10F 10/166 |
| CN | 118841470 | A | | 10/2024 | |
| EP | 4376099 | A2 | | 5/2024 | |

OTHER PUBLICATIONS

English machine translation for Ji et al. (CN 102044579) published May 4, 2011.*

English machine translation for Hu et al. (CN 118248749) published Jun. 25, 2024.*

Extended European Search Report for European Application No. 25177181.2 mailed Oct. 20, 2025.

* cited by examiner

4/5

BACK-CONTACT SOLAR CELL AND PHOTOVOLTAIC MODULE

CROSS-REFERENCE TO RELATED APPLICATIONS

This application claims priority to Chinese Patent Application No. 202510319642.6, filed on Mar. 18, 2025, the content of which is hereby incorporated by reference in its entirety.

TECHNICAL FIELD

The present disclosure relates to the technical field of solar cell preparation, and particularly to a back-contact solar cell and a method for preparing the same, and a photovoltaic module.

BACKGROUND

Back-contact solar cell (BC cell) refers to a solar cell structure in which the positive and negative metal electrodes are arranged in an interdigitated manner on the backlight side of the cell, with a back-junction and back contact. The substrate of BC cells is monocrystalline silicon, with the PN junction and metal electrodes located on the back side of the cell, and no metal electrode to block light on the front side, thus a relatively high short-circuit current and conversion efficiency can be obtained.

SUMMARY

Accordingly, it is necessary to provide a back-contact solar cell and a method for preparing the same, and a photovoltaic module to address the problem that the passivation effect of the doped semiconductor layer and the tunneling layer is destroyed during the preparation of the back-contact solar cell in the prior art.

In a first aspect, a back-contact solar cell is provided, including:

- a substrate having a front side and a back side that are arranged opposite to each other, wherein a first doped portion and a second doped portion that are arranged alternately on the back side;
- a first doped functional layer located on the first doped portion, wherein the first doped functional layer includes a first doped semiconductor sub-layer and at least one barrier layer that are sequentially stacked in a direction away from the substrate, and the first doped semiconductor sub-layer includes a first doping element;
- a second doped semiconductor layer located on the second doped portion, wherein the second doped semiconductor layer includes a second doping element having a conductivity type different from a conductivity type of the first doping element;
- a transparent conductive layer including a plurality of first conductive portions and a plurality of second conductive portions, wherein the plurality of first conductive portions are arranged on a side of the first doped functional layer away from the substrate, and the plurality of second conductive portions are arranged on a side of the second doped semiconductor layer away from the substrate;
- a first electrode arranged on a side of the first conductive portion away from the substrate; and

- a second electrode arranged on a side of the second conductive portion away from the substrate;
- wherein the at least one barrier layer is provided with a plurality of first holes, and a part of the first conductive portion is located in the plurality of first holes and is electrically connected to the first doped semiconductor sub-layer.

In some embodiments, the first doped functional layer further includes a second doped semiconductor sub-layer arranged on a side of the at least one barrier layer away from the substrate.

The second doped semiconductor sub-layer is provided with a plurality of second holes, and the plurality of second holes are in communication with the plurality of first holes in one-to-one correspondence.

A part of the first conductive portion is located in the plurality of first holes and the plurality of second holes, and is electrically connected to the first doped semiconductor sub-layer.

In some embodiments, a thickness of the first doped semiconductor sub-layer is in a range of 30 nm to 150 nm; and/or a thickness of the at least one barrier layer is in a range of 0.5 nm to 3 nm; and/or a thickness of the second doped semiconductor sub-layer is in a range of 10 nm to 60 nm.

In some embodiments, a concentration of the first doping element in the first doped semiconductor sub-layer is in a range of $3\times10^{19}$ atom/$cm_3$ to $5\times10^{20}$ atom/$cm^3$; and/or a concentration of the first doping element in the second doped semiconductor sub-layer is in a range of $4\times10^{19}$ atom/$cm^3$ to $5\times10^{20}$ atom/$cm^3$ In some embodiments, a material of the barrier layer comprises at least one of silicon oxide, silicon nitride, and silicon oxynitride.

In some embodiments, the back-contact solar cell further includes:

- a tunneling layer located between the substrate and the first doped functional layer;
- an intrinsic microcrystalline silicon layer located between the substrate and the second doped semiconductor layer.

In some embodiments, a thickness of the first doped functional layer is greater than a thickness of the second doped semiconductor layer; and/or

- a thickness of the tunneling layer is in a range of 0.5 nm to 1.5 nm; and/or
- a thickness of the intrinsic microcrystalline silicon layer is in a range of 4 nm to 14 nm.

In some embodiments, the first doping element is an N-type doping element, and the second doping element is a P-type doping element.

In some embodiments, the back side is further provided with a gap between the first doped portion and the second doped portion. The first doped functional layer and adjacent second doped semiconductor layer are spaced apart by the gap, and the first conductive portion and adjacent second conductive portion are spaced apart by the gap.

In some embodiments, both the first doped portion and the second doped portion comprise a first sub-area and a second sub-area, and the first electrode or the second electrode is arranged in the first sub-area.

In some embodiments, the first sub-area is classified as a metal contact area, the second sub-area is classified as a non-metal contact area; and a width of the metal contact area is greater than a width of the first electrode, or a width of the metal contact area is greater than a width of the second electrode.

In some embodiments, a material of the transparent conductive layer comprises at least one of indium tin oxide, indium tungsten oxide, zinc aluminum oxide, titanium-doped indium oxide, and fluorine-doped tin oxide.

In some embodiments, the back-contact solar cell further includes a passivation layer and an anti-reflection layer that are sequentially stacked on the front side.

In a second aspect, based on the same application concept, a method for preparing the back-contact solar cell is provided, including:

providing a substrate, wherein the substrate has a front side and a back side that are arranged opposite to each other, and the back side is provided with a first doped portion and a second doped portion that are arranged alternately;

forming a first doped functional layer in the first doped portion, wherein the first doped functional layer comprises a first doped semiconductor sub-layer and at least one barrier layer that are sequentially stacked in a direction away from the substrate, and the first doped semiconductor sub-layer includes a first doping element;

forming a second doped semiconductor layer in the second doped portion, wherein the second doped semiconductor layer includes a second doping element having a conductivity type different from a conductivity type of the first doping element;

forming a transparent conductive layer on a side of the first doped functional layer and the second doped semiconductor layer away from the substrate, wherein the transparent conductive layer comprises a plurality of first conductive portions and a plurality of second conductive portions, the plurality of first conductive portions are arranged on the side of the first doped functional layer away from the substrate, and the plurality of second conductive portions are arranged on the side of the second doped semiconductor layer away from the substrate;

forming a first electrode on a side of the first conductive portion away from the substrate; and forming a second electrode on a side of the second conductive portion away from the substrate;

wherein the at least one barrier layer is provided with a plurality of first holes, and a part of the first conductive portion is located in the plurality of first holes and is electrically connected to the first doped semiconductor sub-layer.

In some embodiments, prior to the step of forming the second doped semiconductor layer in the second doped portion, the method further includes:

cleaning the first doped functional layer with an alkaline solution and then an acidic solution to form a plurality of first holes extending through the at least one barrier layer.

In some embodiments, the step of forming a first doped functional layer in the first doped portion includes:

Sequentially forming a first initial doped semiconductor sub-layer, at least one initial barrier layer, and a second initial doped semiconductor sub-layer on the back side of the substrate;

removing parts of the first initial doped semiconductor sub-layer, the at least one initial barrier layer, and the second initial doped semiconductor sub-layer corresponding to the second doped portion to form the first doped functional layer.

In a third aspect, a photovoltaic module is provided, including:

at least one cell string formed by connecting a plurality of any of the above-mentioned back-contact solar cells or a plurality of back-contact solar cells prepared by any of the above-mentioned method;

an interconnector electrically connected two adjacent back-contact solar cells;

a packaging film covering a surface of the at least one cell string; and a cover plate covering a surface of the packaging film away from the at least one cell string.

In an embodiment of the present disclosure, the first doped functional layer includes the first doped semiconductor sub-layer and at least one barrier layer that are sequentially stacked in the direction away from the substrate, and the barrier layer can prevent damage caused by alkaline cleaning and hydrofluoric acid cleaning. Firstly, prior to preparing the film layer on the second doped portion, it is required to perform an alkaline cleaning (cleaning using an alkaline solution) on the film layer prepared on the first doped portion. The barrier layer can prevent the film layer on the first doped portion from forming too many holes due to the alkaline cleaning, and only a certain number of first holes are formed. The first holes extend mostly in a thickness direction perpendicular to the substrate (i.e., a second direction), thus avoiding the formation of large holes in a direction parallel to the plane where the substrate is located, thereby ensuring the passivation effect of the tunneling layer and the first doped semiconductor sub-layer, and improving the efficiency and bifaciality of solar cells. Secondly, prior to preparing the film layer on the second doped portion, it is required to perform a hydrofluoric acid cleaning on the film layer prepared on the first doped portion. The barrier layer can reduce the depth of the holes extending in the thickness direction perpendicular to the substrate (i.e., the second direction), that is, it avoids the tunneling layer from being etching by the hydrofluoric acid cleaning, thereby improving the passivation effect of the tunneling layer and improving the efficiency and bifaciality of solar cells. Thirdly, the depth of the first holes extending in the thickness direction perpendicular to the substrate (i.e., the second direction) can be controlled by controlling the thickness of the barrier layer, thereby avoiding the first holes from damaging the tunneling layer, improving the passivation effect of the tunneling layer, and improving the efficiency and bifaciality of solar cells.

BRIEF DESCRIPTION OF THE DRAWINGS

To illustrate the technical solutions according to the embodiments or exemplary embodiments of the present disclosure more clearly, the accompanying drawings for describing the embodiments or exemplary embodiments are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION

Figure 1:
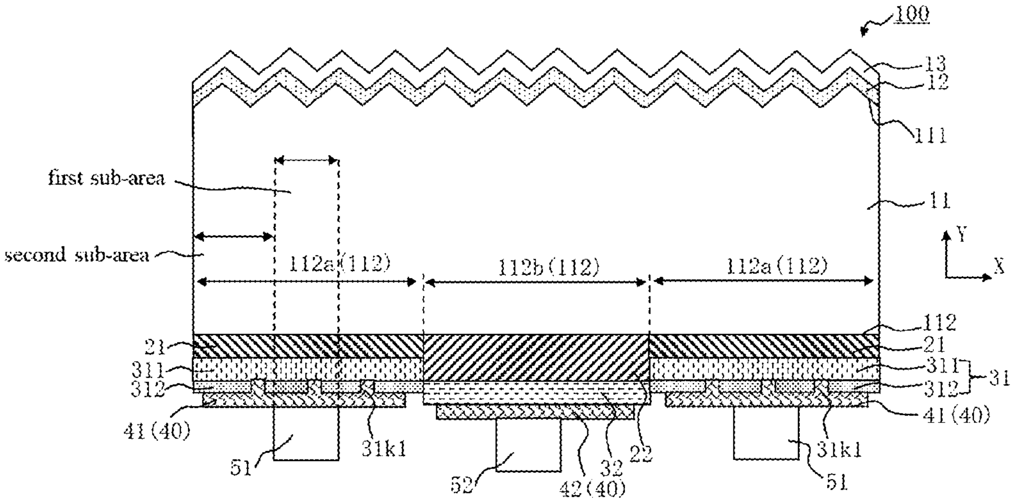
FIG. 1 is a first cross-sectional view of a back-contact solar cell according to an embodiment of the present disclosure.

For In order to make the above objectives, features and advantages of the present disclosure more obvious and understandable, specific embodiments of the present disclosure are described in detail below with reference to the accompanying drawings. In the following description, many specific details are set forth in order to fully understand the present disclosure. However, the present disclosure can be implemented in many other ways different from those described herein, and those skilled in the art can make similar improvements without departing from the connotation of the present disclosure. Therefore, the present disclosure is not limited by the specific embodiments disclosed below.

In the description of the present disclosure, it should be understood that terms “center”, “longitudinal”, “transverse”, “length”, “width”, “thickness”, “upper”, “lower”, “front”, “rear”, “left”, “right”, “vertical”, “horizontal”, “top”, “bottom”, “inside”, “outside”, “clockwise”, “counterclockwise”, “axial”, “radial”, “circumferential”, etc. indicate an orientation or a positional relationship based on an orientation or a positional relationship shown in the drawings, which is only for the purpose of facilitating and simplifying the description of the present disclosure, rather than indicates or implies that the device or elements must have a specific orientation, be constructed and operated in a specific orientation, and therefore cannot be construed as limitation of the present disclosure.

In addition, the terms “first” and “second” are used for descriptive purposes only, which cannot be construed as indicating or implying a relative importance, or implicitly specifying the number of the indicated technical features. Therefore, the features defined with “first” and “second” may explicitly or implicitly include at least one of the features. In the description of the present disclosure, “plurality” means at least two, such as two, three, etc., unless otherwise specifically defined.

In the present disclosure, unless otherwise explicitly specified and defined, the terms “mounted”, “coupled”, “connected”, and “fixed” should be understood in a broad sense. For example, it may be a fixed connection, or a detachable connection, or integrated; it may be a mechanical connection, or an electrical connection; it may be a direct connection, an indirect connection through an intermediate medium, it may be an internal connection between two elements, or an interaction between two elements. For a person skilled in the art, the specific meaning of the aforementioned terms in the present disclosure can be understood according to specific situations.

In the present disclosure, unless otherwise explicitly specified and defined, a first feature being “on” or “under” a second feature may mean that the first feature is in direct contact with the second feature, or the first feature is in indirect contact with the second feature via an intermediate medium. Furthermore, the first feature being “above”, “over”, or “on” the second feature may refer to that the first feature is directly above or obliquely above the second feature, or refer to that the height of the first feature is greater than the height of the second feature. The first feature being “below”, “underneath” or “under” the second feature may refer to that the first feature is directly below or obliquely below the second feature, or refer to that the height of the first feature is less than the second feature.

It should be noted that, if an element is referred to as being “fixed to” or “disposed on” another element, the element may be directly on another element or there may be an intermediate element therebetween. If an element is referred to as “connected to” another element, the element may be directly connected to another element or there may be an intermediate element therebetween. If present, the terms “vertical”, “horizontal”, “upper”, “lower”, “left”, “right”, and similar expressions used herein are for illustrative purposes only and are not meant to be the only means of implementation.

Figure 2:
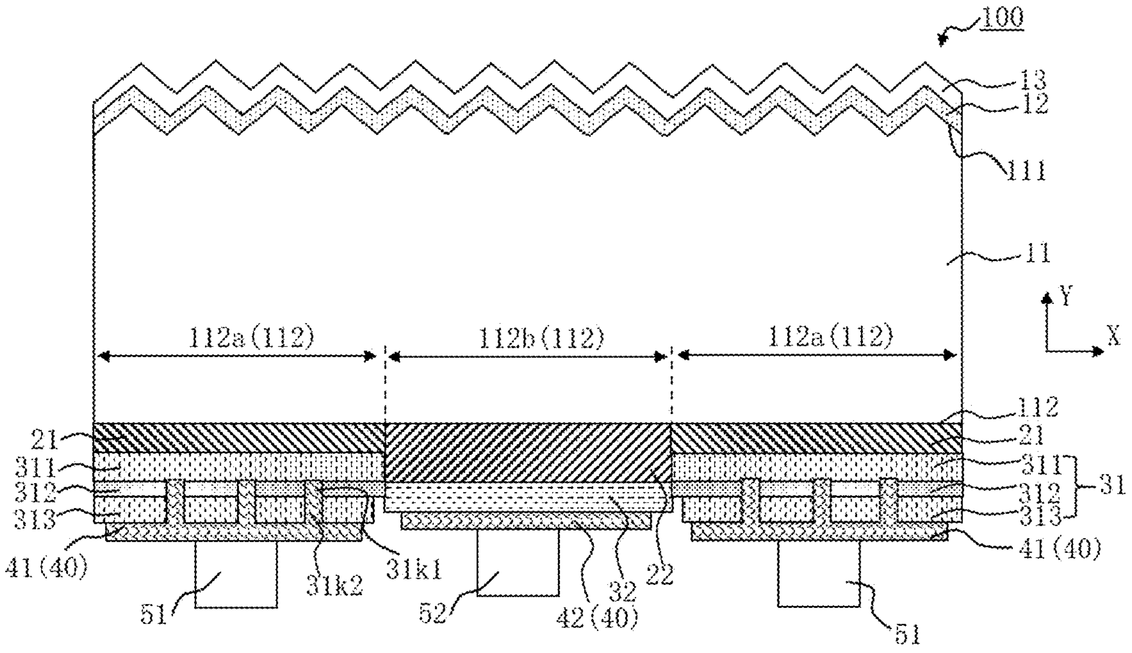
FIG. 2 is a second cross-sectional view of a back-contact solar cell according to another embodiment of the present disclosure.
Figure 3:
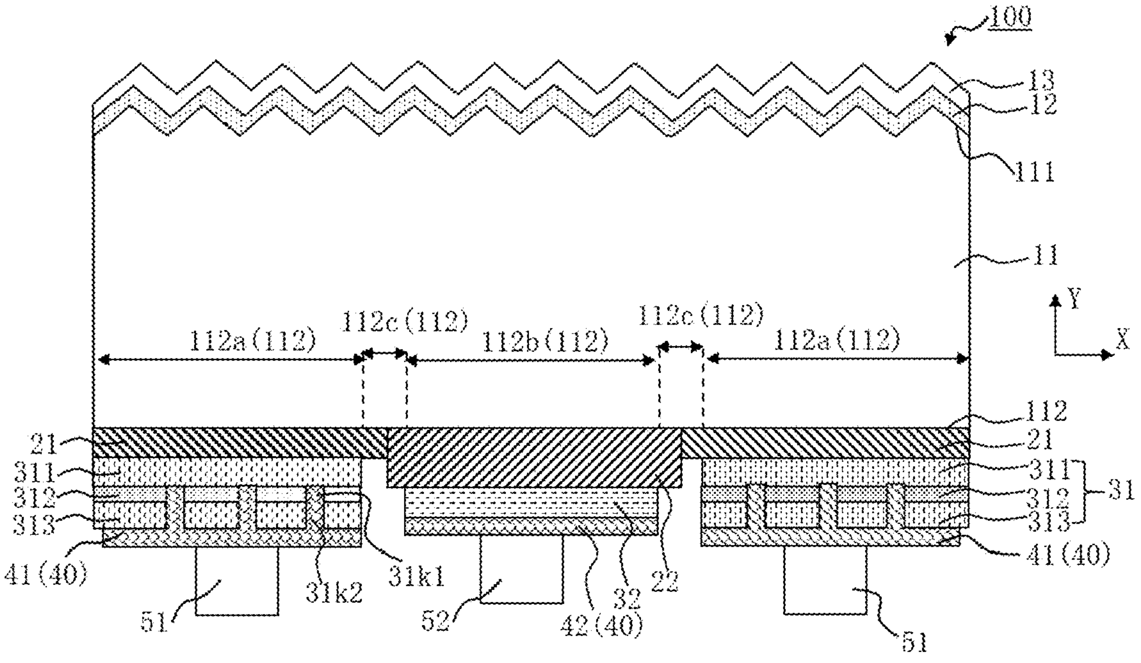
FIG. 3 is a third cross-sectional view of a back-contact solar cell according to yet another embodiment of the present disclosure.

Refer to FIGS. 1 to 3, FIG. 1 is a first cross-sectional view of a back-contact solar cell provided according to an embodiment of the present disclosure, FIG. 2 is a second cross-sectional view of a back-contact solar cell provided according to an embodiment of the present disclosure, and FIG. 3 is a third cross-sectional view of a back-contact solar cell provided according to an embodiment of the present disclosure.

In a first aspect, a back-contact solar cell 100 is provided, including a substrate 11, a first doped functional layer 31, a second doped semiconductor layer 32, a transparent conductive layer 40, a first electrode 51, and a second electrode 52.

The substrate 11 has a front side 111 and a back side 112 that are arranged opposite to each other, and a first doped portion **112*a* and a second doped portion 112*b* that are arranged alternately on the back side 112. The first doped functional layer 31 is located on the first doped portion 112*a*. The first doped functional layer 31 includes a first doped semiconductor sub-layer 311 and at least one barrier layer 312 that are sequentially stacked in a direction away from the substrate 11, and the first doped semiconductor sub-layer 311 includes a first doping element. The second doped semiconductor layer 32 is located on the second doped portion 112*b*, and the second doped semiconductor layer 32** includes a second doping element having a conductivity type different from a conductivity type of the first doping element.

The transparent conductive layer 40 includes a plurality of first conductive portions 41 and a plurality of second conductive portions 42. The plurality of first conductive portions 41 are arranged on a side of the first doped functional layer 31 away from the substrate 11, and the plurality of second conductive portions 42 are arranged on a side of the second doped semiconductor layer 32 away from the substrate 11.

The first electrode 51 is located in the first doped portion **112*a* and arranged on a side of the first conductive portion 41 away from the substrate 11. The second electrode 52 is located in the second doped portion 112*b* and arranged on a side of the second conductive portion 42 away from the substrate 11. The at least one barrier layer 312 is provided with a plurality of first holes 31*k*1, and a part of the first conductive portion 41 is located in the plurality of first holes 31*k*1 and is electrically connected to the first doped semiconductor sub-layer 311**.

In one embodiment, the substrate 11 may contain a doping element, and a conductivity type of the doping element is N-type or P-type. The N-type element may be a Group V element such as phosphorus (P), bismuth (Bi), antimony (Sb), or arsenic (As), and the P-type element may be a Group III element such as boron (B), aluminum (Al), gallium (Ga), or indium (In). For example, when the substrate 11 is a P-type substrate, the conductivity type of the doping element inside is P-type. For another example, when the substrate 11 is an N-type substrate, the conductivity type of the doping element inside is N-type.

In one embodiment, the substrate 11 has a front side 111 and a back side 112 that are arranged opposite to each other. The front side 111 and the back side 112 are arranged opposite to each other in a thickness direction of the substrate 11. Both the front side 111 and the back side 112 can be used to receive incident light. In an embodiment of the present disclosure, the front side 111 of the substrate 11 is the primary light-receiving side, and the back side 112 of the substrate 11 is the secondary light-receiving side. It can be understood that the light-receiving side and the backlight side are relative terms. The light-receiving side is specifically the side on which sunlight mainly illuminates on the substrate 11 in the back-contact solar cell or a photovoltaic module. With the development of solar cell technology, the backlight side can also receive energy from sunlight, mainly from reflected light or scattered light in the surrounding environment.

In one embodiment, the back side 112 includes the first doped portion 112*a* and the second doped portion 112*b* that are arranged alternately, and both the first doped portion 112*a* and the second doped portion 112*b* may include a first sub-area and a second sub-area. The first electrode 51 or the second electrode 52 may be arranged in the first sub-area, and the first sub-area may be classified as a metal contact area. The second sub-area may be an area other than the first sub-area, and the second sub-area may be classified as a non-metal contact area.

In one embodiment, as shown in FIG. 1, a first direction X is parallel to the plane where the substrate 11 is located, and the first doped portion 112*a* and the second doped portion 112*b* are arranged alternately at least in the first direction X.

In one embodiment, as shown in FIG. 1, in the first direction X, a width of the metal contact area is greater than a width of the first electrode 51, and/or a width of the metal contact area is greater than a width of the second electrode 52, but is not limited hereto. For example, due to process errors, the width of the metal contact area may be configured to be greater than the width of the first electrode 51, or greater than the width of the second electrode 52, which can ensure that the first electrode 51 and the second electrode 52 are located in the corresponding metal contact areas.

In one embodiment, as shown in FIG. 1, the first doped semiconductor sub-layer 311, the at least one barrier layer 312, the first conductive portion 41, and the first electrode 51 are sequentially stacked on the first doped portion 112*a* on the back side 112.

In one embodiment, as shown in FIG. 1, the second doped semiconductor layer 32, the second conductive portion 42, and the second electrode 52 are sequentially stacked on the second doped portion 112*b* on the back side 112.

In one embodiment, the first doped semiconductor sub-layer 311 includes a first doping element, and the second doped semiconductor layer 32 includes a second doping element having a conductivity type different from a conductivity type of the first doping element. One of the first doping element and the second doping element is an N-type doping element, and the other thereof is a P-type doping element. In one embodiment, the first doping element being an N-type doping element and the second doping element being a P-type doping element are taken as an example for illustration.

In one embodiment, the at least one barrier layer 312 is provided with a plurality of first holes 31*k*1, and a part of the first conductive portion 41 is located in the plurality of first holes 31*k*1 and is electrically connected to the first doped semiconductor sub-layer 311. That is, although the at least one barrier layer 312 is provided, a plurality of first holes 31*k*1 are provided on the barrier layer 312, and the first conductive portion 41 can be electrically connected to the first doped semiconductor sub-layer 311 through the plurality of first holes 31*k*1.

In one embodiment, a material of the transparent conductive layer 40 includes at least one of indium tin oxide, indium tungsten oxide, zinc aluminum oxide, titanium-doped indium oxide, and fluorine-doped tin oxide.

In one embodiment, the bifaciality and light utilization rate of back-contact solar cells in the prior art need to be improved, and the passivation effect of the doped semiconductor layer and the tunneling layer is destroyed during the preparation of solar cells, the inventors found that the reasons include: 1) it is required to first prepare a film layer on one of the first doped portion 112*a* and the second doped portion 112*b*, and then prepare a film layer on the other of the first doped portion 112*a* and the second doped portion 112*b*. For example, it is required to first prepare a film layer of the first doped portion 112*a*, and then prepare a film layer of the second doped portion 112*b*. For example, it is required to first prepare a film layer of the first doped semiconductor sub-layer 311, and then prepare a film layer of the second doped semiconductor layer 32. Prior to preparing the film layer of the second doped portion 112*b*, it is required to perform an alkaline cleaning (cleaning using an alkaline solution) on the prepared film layer of the first doped portion 112*a*. The alkaline cleaning is prone to cause a large number of holes formed in the film layer of the first doped portion 112*a*, for example, a large number of holes formed in the tunneling layer 21 and the first doped semiconductor sub-layer 311, which reduces the passivation effect of the tunneling layer 21 and the first doped semiconductor sub-layer 311, resulting in reduced efficiency and bifaciality of solar cells. 2) Prior to preparing the film layer of the second doped portion 112*b*, it is required to perform a hydrofluoric acid cleaning on the prepared film layer of the first doped portion 112*a*. The hydrofluoric acid cleaning can easily etch away part of the tunneling layer 21, which reduces the passivation effect of the tunneling layer 21, resulting in reduced efficiency and bifaciality of solar cells.

In an embodiment of the present disclosure, the first doped functional layer 31 includes the first doped semiconductor sub-layer 311 and at least one barrier layer 312 that are sequentially stacked in the direction away from the substrate 11, and the barrier layer 312 can prevent damage caused by alkaline cleaning and hydrofluoric acid cleaning. Firstly, prior to preparing the film layer on the second doped portion 112*b*, it is required to perform an alkaline cleaning (cleaning using an alkaline solution) on the film layer prepared on the first doped portion 112*a*. The barrier layer 312 can prevent the film layer on the first doped portion 112*a* from forming too many holes due to the alkaline cleaning, and only a certain number of first holes 31*k*1 are formed. The first holes 31*kl* extend mostly in a thickness direction perpendicular to the substrate 11 (i.e., a second direction Y), thus avoiding the formation of large holes in a direction parallel to the plane where the substrate 11 is located, thereby ensuring the passivation effect of the tunneling layer 21 and the first doped semiconductor sub-layer 311, and improving the efficiency and bifaciality of solar cells. Secondly, prior to preparing the film layer on the second doped portion 112*b*, it is required to perform a hydrofluoric acid cleaning on the film layer prepared on the first doped portion 112*a*. The barrier layer 312 can reduce the depth of the holes extending in the thickness direction perpendicular to the substrate 11 (i.e., the second direction Y), that is, it avoids the tunneling layer 21 from being etching by the hydrofluoric acid cleaning, thereby improving the passivation effect of the tunneling layer 21 and improving the efficiency and bifaciality of solar cells. Thirdly, the depth of the first holes 31*k*1 extending in the thickness direction perpendicular to the substrate 11 (i.e., the second direction Y) can be controlled by controlling the thickness of the barrier layer 312, thereby avoiding the first holes 31*k*1 from damaging the tunneling layer 21, improving the passivation effect of the tunneling layer 21, and improving the efficiency and bifaciality of solar cells.

In some embodiments, as shown in FIG. 2, the first doped functional layer 31 further includes a second doped semiconductor sub-layer 313 arranged on a side of the at least one barrier layer 312 away from the substrate 11. The second doped semiconductor sub-layer 313 is provided with a plurality of second holes 31*k*2, and the plurality of second holes 31*k*2 are in communication with the plurality of first holes 31*k*1 in one-to-one correspondence. A part of the first conductive portion 41 is located in the plurality of first holes 31*k*1 and the plurality of second holes 31*k*2, and is electrically connected to the first doped semiconductor sub-layer 311.

In one embodiment, as shown in FIG. 2, the first doped semiconductor sub-layer 311, the at least one barrier layer 312, the second doped semiconductor sub-layer 313, the first conductive portion 41, and the first electrode 51 are sequentially stacked on the first doped portion 112*a* on the back side 112.

In one embodiment, as shown in FIG. 2, a conductivity type of doping element in the second doped semiconductor sub-layer 313 is the same as a conductivity type of doping element in the first doped semiconductor sub-layer 311. For example, both the second doped semiconductor sub-layer 313 and the first doped semiconductor sub-layer 311 are doped with the first doping element. For example, the second doped semiconductor sub-layer 313 and the first doped semiconductor sub-layer 311 have the same material, that is, the main body material and the doping element are the same.

In one embodiment, as shown in FIG. 2, the plurality of second holes 31*k*2 are in communication with the plurality of first holes 31*k*1 in one-to-one correspondence, and the first conductive portion 41 is electrically connected to the first doped semiconductor sub-layer 311 through the interconnected first holes 31*k*1 and the second holes 31*k*2.

In one embodiment, as shown in FIG. 2, the second doped semiconductor sub-layer 313 can be well electrically connected to the first conductive portion 41, while it can also play a role in blocking the extension of holes. In other words, the second doped semiconductor sub-layer 313 can improve the electrical connection performance of the film layer in the first doped portion 112*a*, while it can also play a role in blocking the extension of holes, thereby improving the passivation effect of the first doped functional layer 31 and the tunneling layer 21, and improving the efficiency and bifaciality of solar cells.

In some embodiments, a thickness of the first doped semiconductor sub-layer 311 is in a range of 30 nm to 150 nm. In some embodiments, a thickness of the at least one barrier layer 312 is in a range of 0.5 nm to 3 nm. In some embodiments, a thickness of the second doped semiconductor sub-layer 313 is in a range of 10 nm to 60 nm.

In one embodiment, in a direction perpendicular to the plane where the substrate 11 is located, i.e., in the second direction Y, the thickness of the first doped semiconductor sub-layer 311 may be any of 30 nm, 50 nm, 70 nm, 90 nm, 100 nm, 120 nm, 140 nm, and 150 nm.

In one embodiment, in the direction perpendicular to the plane where the substrate 11 is located, i.e., in the second direction Y, the thickness of the barrier layer 312 can be any of 0.5 nm, 1 nanometer, 1.5 nm, 2 nm, 2.5 nm, and 3 nm.

In one embodiment, in the direction perpendicular to the plane where the substrate 11 is located, i.e., in the second direction Y, the thickness of the second doped semiconductor sub-layer 313 can be any of 10 nm, 20 nm, 30 nm, 40 nm, 50 nm, and 60 nm.

In one embodiment, the thickness of the at least one barrier layer 312 is relatively thin, so as to avoid failure to form the first holes 31*k*1 and/or the second holes 31*k*2.

In one embodiment, the first doped semiconductor sub-layer 311 is thicker than that of the second doped semiconductor sub-layer 313, thus the passivation effect of the first doped semiconductor sub-layer 311 can be improved.

In some embodiments, a concentration of the first doping element in the first doped semiconductor sub-layer 311 is in a range of $3\times10^{19}$ atom/cm$^3$ to $5\times10^{20}$ atom/cm$^3$. In some embodiments, a concentration of the first doping element in the second doped semiconductor sub-layer 313 is in a range of $4\times10^{19}$ atom/cm$^3$ to $5\times10^{20}$ atom/cm$^3$.

In one embodiment, the doping concentrations in the first doped semiconductor sub-layer 311 and the second doped semiconductor sub-layer 313 may be close, and the at least one barrier layer 312 is relatively thin, such that the first doped functional layer 31 is an integral semiconductor structure.

In some embodiments, a material of the barrier layer 312 includes at least one of silicon oxide, silicon nitride, and silicon oxynitride.

In one embodiment, the material of the barrier layer 312 includes at least one of silicon oxide, silicon nitride, and silicon oxynitride, which can effectively block etching of alkaline solutions and acidic solutions.

In some embodiments, as shown in FIGS. 1 to 3, the back-contact solar cell 100 further includes a tunneling layer 21 and an intrinsic microcrystalline silicon layer 22. The tunneling layer 21 is located between the substrate 11 and the first doped functional layer 31, and the intrinsic microcrystalline silicon layer 22 is located between the substrate 11 and the second doped semiconductor layer 32.

In one embodiment, as shown in FIG. 2, the tunneling layer 21, the first doped semiconductor sub-layer 311, the at least one barrier layer 312, the second doped semiconductor sub-layer 313, the first conductive portion 41, and the first electrode 51 are sequentially stacked on the first doped portion 112*a* on the back side 112.

In one embodiment, as shown in FIG. 2, the intrinsic microcrystalline silicon layer 22, the second doped semiconductor layer 32, the second conductive portion 42, and the second electrode 52 are sequentially stacked on the second doped portion 112*b* on the back side 112.

In one embodiment, a material of the first tunneling layer 21 can include silicon oxide, but is not limited hereto.

In one embodiment, as shown in FIGS. 1 to 3, the back-contact solar cell 100 is in a heterostructure, in which the intrinsic microcrystalline silicon layer 22 and the second doped semiconductor layer 32 are sequentially arranged in the second doped portion 112*b*, and the second doped semiconductor layer 32 may be P-type amorphous silicon.

In some embodiments, a thickness of the first doped functional layer 31 is greater than a thickness of the second doped semiconductor layer 32. In some embodiments, a thickness of the tunneling layer 21 is in a range of 0.5 nm to 1.5 nm. In some embodiments, a thickness of the intrinsic microcrystalline silicon layer 22 is in a range of 4 nm to 14 nm.

In one embodiment, in the direction perpendicular to the plane where the substrate 11 is located, i.e., in the second direction Y, the thickness of the first doped functional layer 31 is greater than the thickness of the second doped semiconductor layer 32.

In one embodiment, in the direction perpendicular to the plane where the substrate 11 is located, i.e., in the second direction Y, the thickness of the tunneling layer 21 can be any of 0.5 nm, 0.8 nanometer, 1 nanometer, 1.2 nm, and 1.5 nm.

In one embodiment, in the direction perpendicular to the plane where the substrate 11 is located, i.e., in the second direction Y, the thickness of the intrinsic microcrystalline silicon layer 22 can be any of 4 nm, 6 nm, 8 nm, 10 nm, 12 nm, and 14 nm.

In some embodiments, the first doping element is an N-type doping element, and the second doping element is a P-type doping element.

In one embodiment, both the first doped semiconductor sub-layer 311 and the second doped semiconductor sub-layer 313 are N-type doped polycrystalline silicon. The second doped semiconductor layer 32 is P-type doped amorphous silicon.

In some embodiments, as shown in FIG. 3, the back side 112 is further provided with a gap 112*c* between the first doped portion 112*a* and the second doped portion 112*b*. The first doped functional layer 31 and adjacent second doped semiconductor layer 32 are spaced apart by the gap 112*c*, and the first conductive portion 41 and adjacent second conductive portion 42 are spaced apart by the gap 112*c*.

In one embodiment, the gap 112*c* is used to separate at least a portion of the film layers of the first doped portion 112*a* from at least a portion of the film layers of the second doped portion 112*b*, so as to avoid short circuit and improve the conversion efficiency of cells.

It should be noted that, as shown in FIGS. 1 to 3, the back-contact solar cell 100 further includes a passivation layer 12 and an anti-reflection layer 13 that are sequentially stacked on the front side 111. A material of the passivation layer 12 can be at least one of $AlO_x$ (aluminum oxide), $SiO_x$ (silicon oxide), a-Si: H (i) (amorphous silicon), etc. A material of the anti-reflection layer 13 can be at least one of $SiN_xO_y$ (silicon oxynitride) and $SiN_x$ (silicon nitride).

Figure 4:
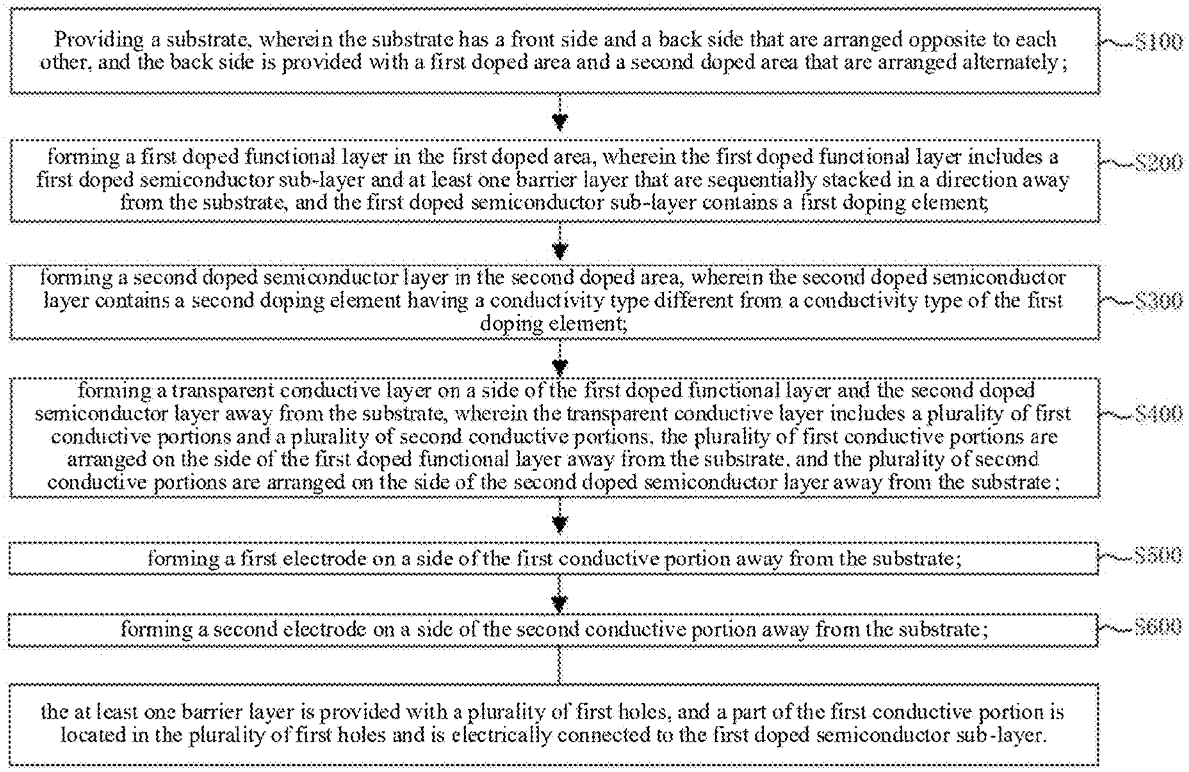
FIG. 4 is a flow chart of a first method for preparing a back-contact solar cell provided according to an embodiment of the present disclosure.
Figure 5:
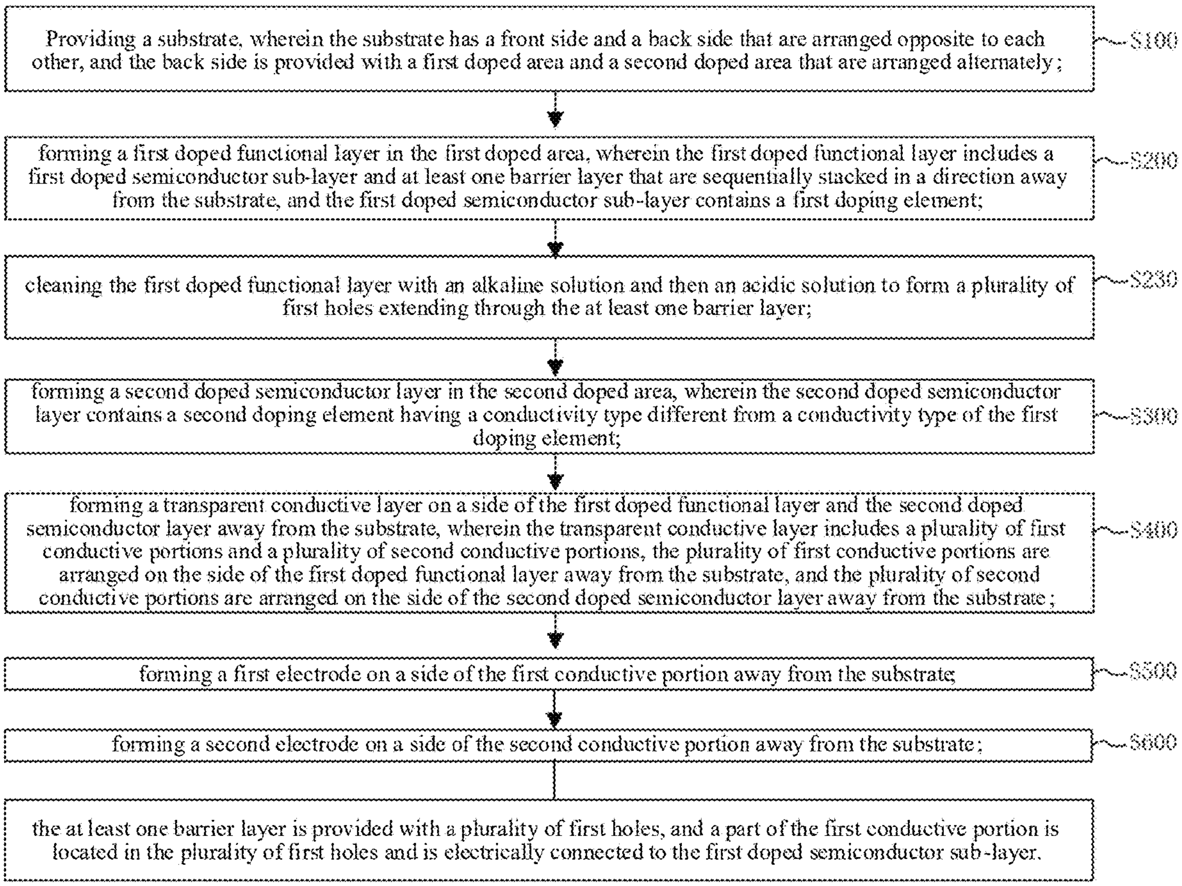
FIG. 5 is a flow chart of a second method for preparing a back-contact solar cell provided according to another embodiment of the present disclosure.

Refer to FIGS. 4 and 5, FIG. 4 is a flow chart of a first method for preparing a back-contact solar cell according to an embodiment of the present disclosure, and FIG. 5 is a flow chart of a second method for preparing a back-contact solar cell according to an embodiment of the present disclosure.

In a second aspect, based on the same application concept, a method for preparing the aforementioned back-contact solar cell is provided. As shown in FIG. 4, the method for preparing the back-contact solar cell includes the following step S100 to step S600.

Step S100, a substrate is provided. The substrate has a front side and a back side that are arranged opposite to each other, and the back side is provided with a first doped portion and a second doped portion that are arranged alternately.

In one embodiment, a substrate 11 is provided. The substrate 11 has a front side 111 and a back side 112 that are arranged opposite to each other, and the back side 112 is provided with a first doped portion 112*a* and a second doped portion 112*b* that are arranged alternately.

Step S200, a first doped functional layer is formed in the first doped portion. The first doped functional layer includes a first doped semiconductor sub-layer and at least one barrier layer that are sequentially stacked in a direction away from the substrate, and the first doped semiconductor sub-layer includes a first doping element.

In one embodiment, a first doped functional layer 31 is formed in the first doped portion 112*a*. The first doped functional layer 31 includes a first doped semiconductor sub-layer 311 and at least one barrier layer 312 that are sequentially stacked in a direction away from the substrate 11, and the first doped semiconductor sub-layer 311 includes a first doping element.

Step S300, a second doped semiconductor layer is formed in the second doped portion. The second doped semiconductor layer includes a second doping element having a conductivity type different from a conductivity type of the first doping element.

In one embodiment, a second doped semiconductor layer 32 is formed in the second doped portion 112*b*. The second doped semiconductor layer 32 includes a second doping element having a conductivity type different from a conductivity type of the first doping element.

Step S400, a transparent conductive layer is formed on a side of the first doped functional layer and the second doped semiconductor layer away from the substrate. The transparent conductive layer includes a plurality of first conductive portions and a plurality of second conductive portions, the plurality of first conductive portions are arranged on the side of the first doped functional layer away from the substrate, and the plurality of second conductive portions are arranged on the side of the second doped semiconductor layer away from the substrate.

In one embodiment, a transparent conductive layer 40 is formed on a side of the first doped functional layer 31 and the second doped semiconductor layer 32 away from the substrate 11. The transparent conductive layer 40 includes a plurality of first conductive portions 41 and a plurality of second conductive portions 42. The plurality of first conductive portions 41 are arranged on a side of the first doped functional layer 31 away from the substrate 11, and the plurality of second conductive portions 42 are arranged on a side of the second doped semiconductor layer 32 away from the substrate 11.

Step S500, a first electrode is formed on a side of the first conductive portion away from the substrate.

In one embodiment, the first electrode 51 is formed on a side of the first conductive portion 41 away from the substrate 11.

Step S600, a second electrode is formed on a side of the second conductive portion away from the substrate.

The at least one barrier layer is provided with a plurality of first holes, and a part of the first conductive portion is located in the plurality of first holes and is electrically connected to the first doped semiconductor sub-layer.

In one embodiment, the second electrode 52 is formed on a side of the second conductive portion 42 away from the substrate 11.

The at least one barrier layer 312 is provided with a plurality of first holes 31*k*1, and a part of the first conductive portion 41 is located in the plurality of first holes **31*k*1 and is electrically connected to the first doped semiconductor sub-layer 311**.

In some embodiments, as shown in FIG. 5, prior to the step of forming the second doped semiconductor layer 32 in the second doped portion **112*b* (step S300), the method further includes: step S230, the first doped functional layer 31 is cleaned with an alkaline solution and then an acidic solution to form a plurality of first holes 31*k*1 extending through the at least one barrier layer 312**.

In one embodiment, as shown in FIG. 5, in combination with FIGS. 2 and 3, prior to the step of forming the second doped semiconductor layer 32 in the second doped portion **112*b* (step S300), the method further includes: step S230, the first doped functional layer 31 is cleaned with an alkaline solution and then an acidic solution to form a plurality of first holes 31*k*1 and a plurality of second holes 31*k*2**.

In one embodiment, the first doped functional layer 31 includes the first doped semiconductor sub-layer 311 and at least one barrier layer 312 that are sequentially stacked in the direction away from the substrate 11, and the barrier layer 312 can prevent damage caused by alkaline cleaning and hydrofluoric acid cleaning. Firstly, prior to preparing the film layer on the second doped portion **112*b*, it is required to perform an alkaline cleaning (cleaning using an alkaline solution) on the film layer prepared on the first doped portion 112*a*. The barrier layer 312 can prevent the film layer on the first doped portion 112*a* from forming too many holes due to the alkaline cleaning, and only a certain number of first holes 31*k*1 are formed. The first holes 31*k*1 extend mostly in a thickness direction perpendicular to the substrate 11 (i.e., a second direction Y), thus avoiding the formation of large holes in a direction parallel to the plane where the substrate 11 is located, thereby ensuring the passivation effect of the tunneling layer 21 and the first doped semiconductor sub-layer 311, and improving the efficiency and bifaciality of solar cells. Secondly, prior to preparing the film layer on the second doped portion 112*b*, it is required to perform a hydrofluoric acid cleaning on the film layer prepared on the first doped portion 112*a*. The barrier layer 312 can reduce the depth of the holes extending in the thickness direction perpendicular to the substrate 11 (i.e., the second direction Y), that is, it avoids the tunneling layer 21 from being etching by the hydrofluoric acid cleaning, thereby improving the passivation effect of the tunneling layer 21 and improving the efficiency and bifaciality of solar cells. Thirdly, the depth of the first holes 31*k*1 extending in the thickness direction perpendicular to the substrate 11 (i.e., the second direction Y) can be controlled by controlling the thickness of the barrier layer 312, thereby avoiding the first holes 31*k*1 from damaging the tunneling layer 21, improving the passivation effect of the tunneling layer 21**, and improving the efficiency and bifaciality of solar cells.

In some embodiments, the step of forming the first doped functional layer 31 in the first doped portion **112*a* (step S200) includes: step 210, a first initial doped semiconductor sub-layer, at least one initial barrier layer, and a second initial doped semiconductor sub-layer are sequentially formed on the back side 112 of the substrate 11; and step 220, parts of the first initial doped semiconductor sub-layer, the at least one initial barrier layer, and the second initial doped semiconductor sub-layer corresponding to the second doped portion 112*b* are removed to form the first doped functional layer 31**.

In one embodiment, in combination with FIG. 1, in some embodiments, different gas materials are introduced sequentially to sequentially form the first initial doped semiconductor sub-layer and at least one initial barrier layer on the back side 112 of the substrate 11; then, a first doped semiconductor sub-layer 311 and at least one barrier layer 312 of the first doped functional layer 31 are formed by the same patterning process/mask, which can simplify the preparation process.

In one embodiment, in combination with FIGS. 2 and 3, in some embodiments, different gas materials are introduced sequentially to sequentially form the first initial doped semiconductor sub-layer, at least one initial barrier layer, and the second initial doped semiconductor sub-layer on the back side 112 of the substrate 11; then, a first doped semiconductor sub-layer 311, at least one barrier layer 312, and a second doped semiconductor sub-layer 313 of the first doped functional layer 31 are formed by the same patterning process/mask, which can simplify the preparation process.

In one embodiment, in combination with the multiple steps of the above-mentioned method for preparing the back-contact solar cell, a specific process of the method for preparing the back-contact solar cell is further described in detail, including the following steps 1)-17):

1) (Step S100) A substrate 11 is provided, and the substrate 11 is subjected to cleaning and polishing.

2) A predetermined material film layer of a first tunneling layer 21 (for example, a tunneling layer of $SiO_x$ material, i.e., an initial tunneling layer) is formed on the back side 112.

3) (Step S200) A first initial doped semiconductor sub-layer, at least one initial barrier layer, and a second initial doped semiconductor sub-layer are sequentially formed on the back side 112 of the substrate 11, and an N-type doping is performed.

4) (Step S200) Parts of the first initial doped semiconductor sub-layer, the at least one initial barrier layer, and the second initial doped semiconductor sub-layer corresponding to the second doped portion **112*b* are removed to form the first doped functional layer 31. That is, the film layers on the back side 112 are patterned, and a $SiO_x/SiN_x$ mask is first formed and then the film layers on the back side 112** are patterned, and the mask pattern is removed.

5) A phosphosilicate glass layer (PSG) on the front side 111 is removed by hydrofluoric acid.

6) Both sides are subjected to etching and texturing.

7) The phosphosilicate glass layer (PSG) in the first doped portion **112*a*** on the back side is removed by hydrofluoric acid and is cleaned;

8) A passivation layer 12 is formed on the front side 111 (the material of the passivation layer 12 may be at least one of $AlO_x$, $SiO_x$, a-Si: H (i)).

9) An anti-reflection layer 13 is formed on the front side 111 (the material of the anti-reflection layer 13 may be at least one of $SiN_xO_y$ and $SiN_x$);

10) The materials of the passivation layer 12 and the anti-reflection layer 13 on the back side 112 are removed by a chain-type back side de-coating.

11) (Step S230) A cleaning (for example, cleaning a surface of the second doped portion **112*b*) is performed. An alkaline cleaning can be performed first, the cleaning agent of the alkaline cleaning includes an alkaline solvent and hydrogen peroxide, and the alkaline solvent includes any one of potassium hydroxide, sodium hydroxide or ammonia water. An acid cleaning can then be performed, and the cleaning agent of the acid cleaning includes hydrofluoric acid. During this cleaning step, first holes 31*k*1 and second holes 31*k*2** are formed.

12) A predetermined material film layer of an intrinsic microcrystalline silicon layer 22 is formed on the entire back side 112 (for example, an amorphous silicon layer is deposited at a temperature below 250° C. to form an initial intrinsic microcrystalline silicon layer).

13) (Step S300) A predetermined material film layer of the second doped semiconductor layer 32 is formed on the entire back side 112 (for example, a P-type doped silicon film layer, which may be one of a-Si: H (p), nc-Si: H (p), nc-$SiO_x$: H (p) or a combination thereof, is deposited at a temperature below 250° C. to form a second initial doped semiconductor layer).

14) (Step S300) The predetermined material film layer of the intrinsic microcrystalline silicon layer 22 and the predetermined material film layer of the second doped semiconductor layer 32 on the back side 112 are patterned, and only the intrinsic microcrystalline silicon layer 22 and the second doped semiconductor layer 32 in the second doped portion 112*b* are retained.

15) (Step S400) A predetermined film layer of a transparent conductive layer 40 is formed on the entire back side 112.

16) (Step S400) The transparent conductive layer 40 is patterned to form a plurality of first conductive portions 41 and a plurality of second conductive portions 42. For example, the plurality of first conductive portions 41 and the plurality of second conductive portions 42 may be formed by an ink etching or laser patterning process.

17) (Step S500 and step S600) A first electrode 51 and a second electrode 52 are formed on the back side, and a light injection process is performed. For example, the first electrode 51 and the second electrode 52 are formed by a screen printing process.

In a third aspect, based on the same application concept, a photovoltaic module is provided, including at least one cell string, an interconnector, a packaging film, and a cover plate. The cell string is formed by connecting a plurality of any of the above-mentioned back-contact solar cells 100, or the cell string is formed by connecting a plurality of back-contact solar cells 100 prepared by any of the above-mentioned method. The interconnector is electrically connected two adjacent back-contact solar cells 100. The packaging film covers a surface of the cell string. The cover plate covers a surface of the packaging film away from the cell string.

Each of the technical features of the aforementioned embodiments can be combined arbitrarily. To simplify the description, not all the possible combinations of the technical features in the aforementioned embodiments are described. However, all of the combinations of these technical features should be considered as within the scope of the present disclosure, as long as such combinations do not contradict with each other.

The aforementioned embodiments merely illustrate several embodiments of the present disclosure, and the description thereof is specific and detailed, but it shall not be constructed as limiting the scope of the disclosure. It should be noted that a plurality of variations and modifications may be made by those skilled in the art without departing from the conception of the present disclosure, which are all within the protection scope of the present disclosure. Therefore, the protection scope of the present disclosure shall be subject to the appended claims.

What is claimed is:

1. A back-contact solar cell, comprising:

a substrate having a front side and a back side that are arranged opposite to each other, wherein a first doped portion and a second doped portion are arranged alternately on the back side;

a first doped functional layer located on the first doped portion, wherein the first doped functional layer comprises a first doped semiconductor sub-layer and at least one barrier layer that are sequentially stacked in a direction away from the substrate, a thickness of the at least one barrier layer is in a range of 0.5 nm to 3 nm, and the first doped semiconductor sub-layer comprises a first doping element, the first doped functional layer further comprising a second doped semiconductor sub-layer arranged on a side of the at least one barrier layer away from the substrate;

a second doped semiconductor layer located on the second doped portion, wherein the second doped semiconductor layer comprises a second doping element having a conductivity type different from a conductivity type of the first doping element;

a transparent conductive layer comprising a plurality of first conductive portions and a plurality of second conductive portions, wherein the plurality of first conductive portions are arranged on a side of the first doped functional layer away from the substrate, and the plurality of second conductive portions are arranged on a side of the second doped semiconductor layer away from the substrate;

a first electrode arranged on a side of the first conductive portion away from the substrate; and a second electrode arranged on a side of the second conductive portion away from the substrate;

wherein the at least one barrier layer is provided with a plurality of first holes, and a part of the first conductive portion is located in the plurality of first holes and is electrically connected to the first doped semiconductor sub-layer; and wherein the second doped semiconductor sub-layer is provided with a plurality of second holes, and the plurality of second holes are in communication with the plurality of first holes in one-to-one correspondence;

wherein a part of the first conductive portion is located in the plurality of first holes and the plurality of second holes, and is electrically connected to the first doped semiconductor sub-layer.

2. The back-contact solar cell according to claim 1, wherein a thickness of the first doped semiconductor sub-layer is in a range of 30 nm to 150 nm.

3. The back-contact solar cell according to claim 1, wherein a thickness of the second doped semiconductor sub-layer is in a range of 10 nm to 60 nm.

4. The back-contact solar cell according to claim 1, wherein a concentration of the first doping element in the first doped semiconductor sub-layer is in a range of $3\times10^{19}$ atom/$cm^3$ to $5\times10^{20}$ atom/$cm^3$.

5. A back-contact solar cell comprising:

a substrate having a front side and a back side that are arranged opposite to each other, wherein a first doped portion and a second doped portion are arranged alternately on the back side;

a first doped functional layer located on the first doped portion, wherein the first doped functional layer comprises a first doped semiconductor sub-layer and at least one barrier layer that are sequentially stacked in a direction away from the substrate, and the first doped semiconductor sub-layer comprises a first doping element, the first doped functional layer further comprising a second doped semiconductor sub-layer arranged on a side of the at least one barrier layer away from the substrate, the second doped semiconductor sub-layer comprising the first doping element;

a second doped semiconductor layer located on the second doped portion, wherein the second doped semiconductor layer comprises a second doping element having a conductivity type different from a conductivity type of the first doping element:

a transparent conductive layer comprising a plurality of first conductive portions and a plurality of second conductive portions, wherein the plurality of first conductive portions are arranged on a side of the first doped functional layer away from the substrate, and the plurality of second conductive portions are arranged on a side of the second doped semiconductor layer away from the substrate;

a first electrode arranged on a side of the first conductive portion away from the substrate; and a second electrode arranged on a side of the second conductive portion away from the substrate;

wherein the at least one barrier layer is provided with a plurality of first holes, and a part of the first conductive portion is located in the plurality of first holes and is electrically connected to the first doped semiconductor sub-layer; and wherein the second doped semiconductor sub-layer is provided with a plurality of second holes, and the plurality of second holes are in communication with the plurality of first holes in one-to-one correspondence;

wherein a part of the first conductive portion is located in the plurality of first holes and the plurality of second holes, and is electrically connected to the first doped semiconductor sub-layer.

6. The back-contact solar cell according to claim 5, wherein a concentration of the first doping element in the second doped semiconductor sub-layer is in a range of $4\times10^{19}$ atom/cm$^3$ to $5\times10^{20}$ atom/cm$^3$.

7. The back-contact solar cell according to claim 1, wherein a material of the at least one barrier layer comprises at least one of silicon oxide, silicon nitride, and silicon oxynitride.

8. The back-contact solar cell according to claim 1, further comprising:

a tunneling layer located between the substrate and the first doped functional layer; and an intrinsic microcrystalline silicon layer located between the substrate and the second doped semiconductor layer.

9. The back-contact solar cell according to claim 1, wherein a thickness of the first doped functional layer is greater than a thickness of the second doped semiconductor layer.

10. The back-contact solar cell according to claim 8, wherein a thickness of the tunneling layer is in a range of 0.5 nm to 1.5 nm.

11. The back-contact solar cell according to claim 8, wherein a thickness of the intrinsic microcrystalline silicon layer is in a range of 4 nm to 14 nm.

12. The back-contact solar cell according to claim 1, wherein the first doping element is an N-type doping element, and the second doping element is a P-type doping element.

13. The back-contact solar cell according to claim 1, wherein the back side is further provided with a gap between the first doped portion and the second doped portion, the first doped functional layer and adjacent second doped semiconductor layer are spaced apart by the gap, and the first conductive portion and adjacent second conductive portion are spaced apart by the gap.

14. The back-contact solar cell according to claim 1, wherein both the first doped portion and the second doped portion comprise a first sub-area and a second sub-area, and the first electrode or the second electrode is arranged in the first sub-area.

15. The back-contact solar cell according to claim 14, wherein the first sub-area is classified as a metal contact area, the second sub-area is classified as a non-metal contact area; and a width of the metal contact area is greater than a width of the first electrode, or a width of the metal contact area is greater than a width of the second electrode.

16. The back-contact solar cell according to claim 1, wherein a material of the transparent conductive layer comprises at least one of indium tin oxide, indium tungsten oxide, zinc aluminum oxide, titanium-doped indium oxide, and fluorine-doped tin oxide.

17. The back-contact solar cell according to claim 1, further comprising a passivation layer and an anti-reflection layer that are sequentially stacked on the front side.

18. A photovoltaic module, comprising:

at least one cell string formed by connecting a plurality of back-contact solar cells according to claim 1;

an interconnector electrically connected to two adjacent back-contact solar cells;

a packaging film covering a surface of the at least one cell string; and a cover plate covering a surface of the packaging film away from the at least one cell string.

* * * * *